(12) United States Patent
Kobayashi et al.

(10) Patent No.: US 10,925,201 B2
(45) Date of Patent: Feb. 16, 2021

(54) OPTIMIZATION DEVICE FOR PRODUCTION LINE

(71) Applicant: FUJI CORPORATION, Chiryu (JP)

(72) Inventors: Hitoshi Kobayashi, Okazaki (JP); Junichi Kako, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 22 days.

(21) Appl. No.: 16/484,634

(22) PCT Filed: Feb. 9, 2017

(86) PCT No.: PCT/JP2017/004742
§ 371 (c)(1),
(2) Date: Aug. 8, 2019

(87) PCT Pub. No.: WO2018/146772
PCT Pub. Date: Aug. 16, 2018

(65) Prior Publication Data
US 2019/0380239 A1 Dec. 12, 2019

(51) Int. Cl.
*H05K 13/08* (2006.01)
*H05K 13/04* (2006.01)
*G05B 19/4155* (2006.01)
*H05K 13/00* (2006.01)

(52) U.S. Cl.
CPC ..... *H05K 13/0882* (2018.08); *G05B 19/4155* (2013.01); *H05K 13/00* (2013.01); *H05K 13/0061* (2013.01); *H05K 13/0409* (2018.08); *G05B 2219/45031* (2013.01); *Y02P 90/02* (2015.11)

(58) Field of Classification Search
CPC .................................. H05K 13/0882
USPC .......................................... 700/121
See application file for complete search history.

(56) References Cited

U.S. PATENT DOCUMENTS

| | | | | |
|---|---|---|---|---|
| 2002/0083026 | A1* | 6/2002 | Eshelman | G06N 3/126 706/14 |
| 2008/0228304 | A1* | 9/2008 | Maenishi | G05B 19/41865 700/108 |
| 2016/0021761 | A1* | 1/2016 | Iwata | H05K 13/085 29/832 |
| 2017/0038752 | A1* | 2/2017 | Iisaka | G05B 19/41875 |

(Continued)

FOREIGN PATENT DOCUMENTS

| | | | |
|---|---|---|---|
| CN | 106185166 A | * | 12/2016 |
| JP | 2004-6557 A | | 1/2004 |

OTHER PUBLICATIONS

International Search Report dated May 16, 2017 in PCT/JP2017/004742 filed Feb. 9, 2017.

*Primary Examiner* — Suresh Suryawanshi
(74) *Attorney, Agent, or Firm* — Oblon, McClelland, Maier & Neustadt, L.L.P.

(57) ABSTRACT

An optimization device is applied to a production line in which multiple production devices respectively execute a production process. The optimization device includes a cycle time setting section configured to set a cycle time for each production device, a target time setting section configured to set a target time based on a cycle time and a time required for periodic operation in each of multiple production devices except for the component mounter, and a line design section configured to calculate the unit number of the component mounters constituting the production line based on the target time.

12 Claims, 7 Drawing Sheets

(56) References Cited

U.S. PATENT DOCUMENTS

2017/0127582 A1* 5/2017 Yasui ................. H05K 3/303
2019/0354090 A1* 11/2019 Oyama ............. H05K 13/0882
2020/0187397 A1* 6/2020 Yamakage ......... H05K 13/0857

* cited by examiner

Table 1: Production plan M1

| Product type | Production number |
|---|---|
| U1 | L1 |
| U2 | L2 |
| U3 | L3 |
| ... | ... |

Table 2: Product information M2

| | Product type | | | |
|---|---|---|---|---|
| | U1 | U2 | U3 | ... |
| Component type | Number of components | Number of components | Number of components | |
| Pa | 3 | 3 | 3 | ... |
| Pb | 4 | 4 | 4 | ... |
| Pc | 0 | 1 | 1 | ... |
| Pd | 2 | 2 | 0 | ... |
| ... | ... | ... | ... | ... |

Table 3: Cycle time information M3

| Mounting-related machine | Cycle time | Periodic operation | | | Actual cycle time |
|---|---|---|---|---|---|
| | | Execution frequency | Required time | Unit operation time | |
| A | Tc1 | Rw1 | Tw1 | TUw1 | Tc1+TUw1 |
| B | Tc2 | — | — | — | Tc2 |
| C | Tc3 | — | — | — | Tc3 |
| D | Tc4 | Rw4 | Tw4 | TUw4 | Tc4+TUw4 |
| ... | ... | ... | ... | ... | ... |

Table 4: Error information M4

| Mounting error type | Error rate | Handling time |
|---|---|---|
| Ea | Re1 | Te1 |
| Eb | Re2 | Te2 |
| Ec | Re3 | Te3 |
| ... | ... | ... |

OPTIMIZATION DEVICE FOR PRODUCTION LINE

TECHNICAL FIELD

The present application relates to an optimization device for a production line.

BACKGROUND ART

In a production line, multiple production devices each execute production processes to produce various board products. The production line is configured by installing multiple production devices such as a printer, a component mounter, an appearance inspection device, and a reflow oven in a conveyance direction of a circuit board. As for the device configuration in such a production line, as disclosed in, for example, patent literature 1, the unit number of the component mounters and the like are designed so that the cycle times in the respective production devices are evened out.

PATENT LITERATURE

Patent Literature 1: JP-A-2004-006557

BRIEF SUMMARY

Technical Problem

When a board product is actually produced in a production line in which the device configuration is designed as described above, the cycle time may be delayed in each production device due to various factors. When such an increase of the cycle time occurs, the line balance deteriorates. In an optimization device for a production line, it is required to design the device configuration so that the line balance is properly maintained in actual production.

An object of the present disclosure is to provide an optimization device for a production line for optimizing the device configuration so as to adapt to actual production.

Solution to Problem

The present description discloses a first optimization device for a production line in which multiple production devices each execute a production process, the multiple production devices including multiple component mounters each configured to mount components on a circuit board by conveying the circuit board along the production line as the production process, at least a portion of the multiple production devices excluding the component mounters each executing a periodic operation accompanied by a stop of conveyance of the circuit board at a predetermined execution frequency during successive of the production processes, the optimization device including: a cycle time setting section configured to set a cycle time for each production device; a target time setting section configured to set a target time based on the cycle time and a required time for the periodic operation in each of the multiple production devices excluding the component mounters, and a line design section configured to calculate the unit number of the component mounters constituting the production line based on the target time.

The present description discloses a second optimization device for a production line in which multiple production devices each execute a production process, the multiple production devices including multiple component mounters each configured to mount components on a circuit board by conveying the circuit board along the production line as the production process, wherein, when a mounting error occurs in which the component is not properly mounted on the circuit board in the production process by the component mounter, a required time of the production process is increased by a handling time in accordance with execution of an error handling corresponding to the mounting error, and wherein the optimization device comprises: a memory section configured to store error information in which an error rate and the handling time are set for each type of the mounting error, based on an assumption of the mounting error occurring at a predetermined error rate, a cycle time setting section configured to set a cycle time in each of the production devices, and configured to add the handling time of the mounting error to the cycle time of the component mounter; a target time setting section configured to set a maximum time of the cycle time in each of the multiple production devices except for the component mounters as a target time, and a line design section configured to calculate the unit number of the component mounters constituting the production line based on the target time.

Advantageous Effects

According to the configuration of the first optimization device for the production line, the unit number of the component mounters is calculated based on the target time set in consideration of the time required for the periodic operation. Conventionally, the production process for which the cycle time is maximized is simply treated as the bottleneck process. On the other hand, the optimization device of the present description sets a target time that includes the required time of the periodic operation, on the assumption that the required time of the periodic operation may be a factor causing a delay in the conveyance of the board. By using such a target time to calculate the unit number of the component mounters, the excess and deficiency of the process capacity of multiple component mounters can be reduced even if the periodic operation is executed. Therefore, the optimization device can optimize the device configuration in the production line adapted to actual production.

According to the configuration of the second optimization device for production line, the unit number of the component mounters is calculated based on the cycle time of the component mounter in consideration of the error handling time for the mounting error. Conventionally, the best time for which it is assumed that no mounting error occurs in the component mounter is simply used as the cycle time of the component mounter. On the other hand, the optimization device of the present description calculates an actual cycle time of the component mounter on the assumption that the error handling time may be a factor causing a delay in the conveyance of the board. By using such a cycle time to calculate the unit number of the component mounters, the excess and deficiency of the process capacity of multiple component mounters can be reduced even if the error handling is executed. Therefore, the optimization device can optimize the device configuration in the production line adapted to actual production.

DESCRIPTION OF EMBODIMENTS

1. First Embodiment 1-1. Configuration of Production Line 10

Figure 1:
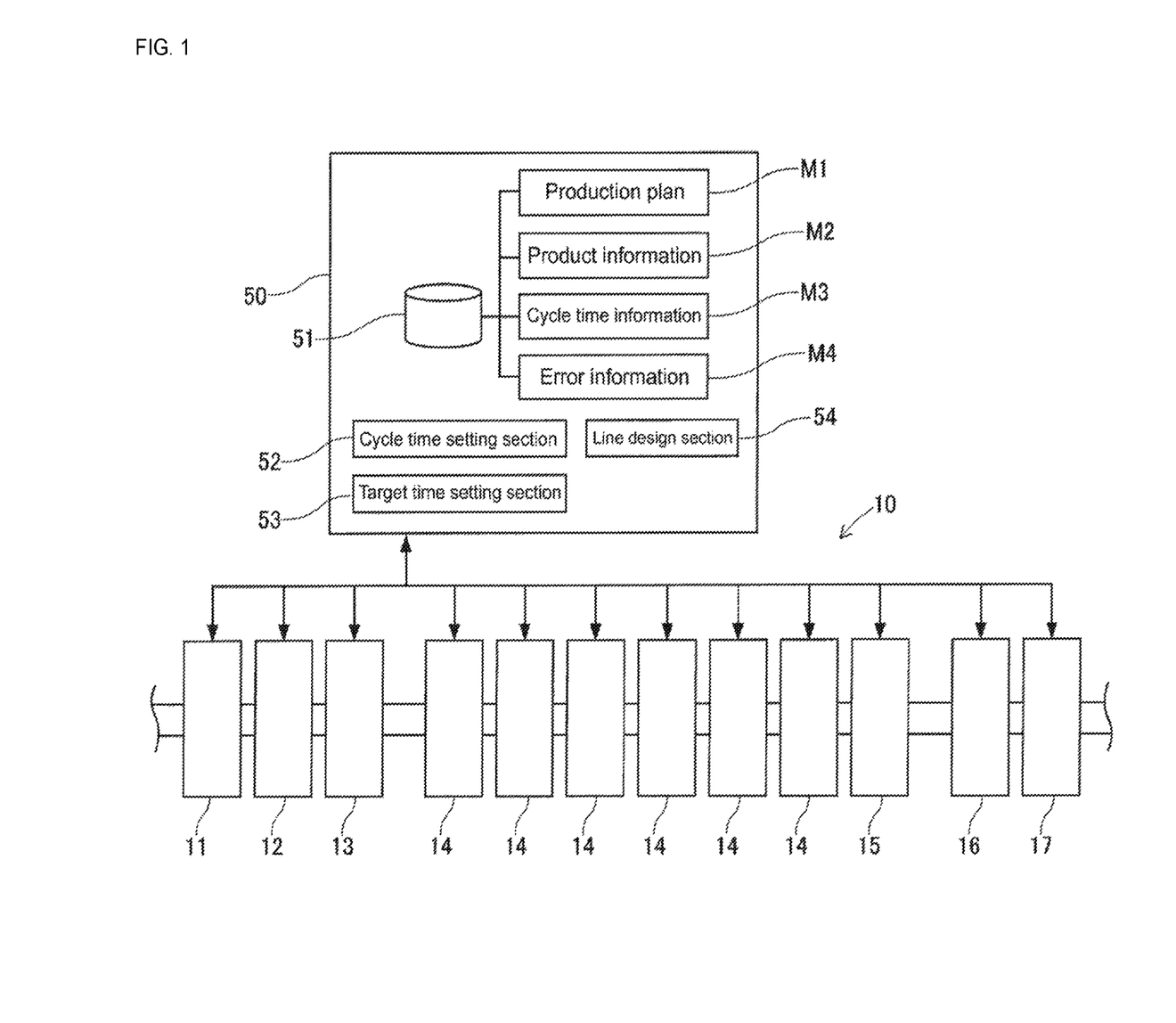
FIG. 1 is a plan view schematically showing a production line in a first embodiment.

An optimization device is applied to a production line in which multiple production devices each execute a production process to produce various board products. As shown in FIG. 1, production line 10 is configured by installing multiple production devices in the conveyance direction (left-right direction in FIG. 1) of a circuit board. Hereinafter, the "circuit board" is simply referred to as a "board". The above-described production device includes printer 11, print inspection device 12, buffer device 13, multiple component mounters 14, appearance inspection device 15, reflow oven 16, and functional tester 17 in order from the upstream side of production line 10.

In the production process by production line 10, the board is loaded into printer 11 positioned at the head of production line 10. Then, the board is conveyed to the downstream side by a board conveyance device of each production device, and is carried out of functional tester 17 positioned at the end of production line 10. The production devices are communicably connected to each other and communicably connected to a host computer (hereinafter referred to as "host PC") in which optimization device 50 is incorporated.

Printer 11 prints a paste-like solder at the mounting position of a component on the loaded board. In the present embodiment, printer 11 moves a squeegee on the upper surface side of a mask on which the printing pattern is formed to perform screen printing as a production process. In such printer 11, since contamination of the mask may affect the printing quality, cleaning is performed every time a predetermined number of boards are printed. Specifically, a cleaning device installed on printer 11 is operated at a predetermined execution frequency between successive printing processes. The cleaning device wipes off the contamination on the mask with a paper coated with a solvent. The above-described cleaning is a periodic operation accompanied by stopping the conveyance of the board and is ended in a substantially fixed required time.

Further, in printer 11, since the solder is consumed in accordance with the execution of the printing process, the solder is replenished every time a predetermined number of boards are printed. Specifically, a replenishing device installed on printer 11 is operated at a predetermined execution frequency between successive printing processes. The replenishing device replenishes solder to the upper surface of the mask along the longitudinal direction of the squeegee. The solder replenishment is a periodic operation accompanied by stopping the conveyance of the board and is ended in a substantially fixed required time.

Print inspection device 12 inspects the printing state of the board on which the solder has been printed by printer 11. Buffer device 13 is configured to hold a number of boards corresponding to a predetermined capacity in production line 10. Buffer device 13 holds the board carried out from the production device on the upstream side until the production device on the downstream side can load the board. Each of multiple component mounters 14 mounts a component on the solder of the board conveyed out from the upstream side of production line 10. The mounting process of component mounter 14 will be described later.

Appearance inspection device 15 inspects the mounting state of the components as an inspection target based on the appearance of the components mounted on the board by component mounter 14 on the upstream side. The mounting state of the components includes the appropriateness of the components mounted on the board, and the mounting position and the mounting orientation of the components. When the appearance inspection is performed, appearance inspection device 15 transmits the result of the appearance inspection to a host PC.

Reflow furnace 16 heats the board conveyed from the upstream side of production line 10, melts the solder on the board to perform soldering. Functional tester 17 performs function inspection of the soldered board. Specifically, functional tester 17 applies a predetermined input signal to the board and acquires an output signal corresponding to the input signal. Then, functional tester 17 inspects whether the board product functions normally based on the acquired output signal.

In this manner, production line 10 conveys the board subsequently to each production device and executes the production processes including the inspection process to produce the board product. The configuration of production line 10 can be appropriately added to or changed according to, for example, the type of board product to be produced. For example, in production line 10, the unit number of multiple component mounters 14 is appropriately set. Alternatively, production line 10 may be configured by installing another production device on the upstream side of printer 11 or on the downstream side of functional tester 17. Other production devices include, for example, a board supplying device, a board flipping device, a shield mounting device, an adhesive application device, and an ultraviolet ray irradiation device.

1-2. Mounting Process by Component Mounter 14

Component mounter 14 executes a mounting process of mounting components on a board as a production process. In the mounting process, component mounter 14 controls the operation of the mounting head holding a component based on a control program generated in advance, information output from various sensors, and a result of a recognition process by image processing or the like. The control program used in the mounting process is generated based on production plan M1 (see FIG. 1) and product information M2.

When a mounting error occurs in which a component is not properly mounted in the executed mounting process, component mounter 14 executes recovery processing. The cause of the mounting error is assumed to be, for example, a component shortage in a supply device for supplying a component, a defect in a supplied component, a defect in a suction nozzle, a solder defect on a board, or the like. The mounting error can be detected based on output values of various sensors provided in the image processing, the mounting head, and the like.

The image processing includes, for example, image processing on image data acquired by imaging of a part camera capable of capturing an image of a component held by a suction nozzle or a board camera capable of capturing an image of a board on which the component is mounted. Further, the above-described recovery processing attempts automatic recovery on the assumption that a mounting error has occurred as a once-off, and is error processing that does not involve interruption of the mounting process (stop of component mounter 14 and stop of conveyance of the board).

However, if a pick-and-place cycle in which the component is mounted on the board after the component is picked up in the mounting process increases, the cycle time of the mounting process may become longer than scheduled. In other words, along with the execution of the error handling such as the recovery processing, the required time (cycle time) of the mounting process as the production process is increased by the handling time. Such error handling is executed according to the type of mounting error, and the handling time may differ depending on the type of error handling.

In component mounter 14, various measures are taken so that mounting errors do not occur. However, according to the performance (error rate) of the mounting process, the mounting error occurs at a certain frequency, such that the cycle time is increased. In addition, the error rate of the mounting error may vary depending on the component type having different mounting difficulties, the mounting condition defining the movement speed of the suction nozzle, and the like. When the cycle time is increased, for example, the conveyance of the board is delayed, and the adjacent component mounters 14 are put in a standby state, which may affect the production time.

1-3. Overview of Production Line Optimization Device 50

Here, in production line 10, the device configuration of production line 10 and the production process in each production device are optimized in consideration of the line balance so that the difference in cycle time in each production device becomes small. Here, in the present description, the "cycle time" of the production device including component mounter 14 means the time required for the production process per one board in the production device.

The cycle time of component mounter 14 corresponds to the time required for the mounting process. In the production of the board product, the component type and the number of pieces to be mounted required for the production are determined based on production plan M1 and product information M2. Each of multiple component mounters 14 is assigned a component type and the number of pieces to be mounted so that, for example, the difference between the maximum value and the minimum value of the cycle time becomes small.

In addition, the unit number of component mounters 14 is designed so that the conveyance of the boards between the production device positioned on the upstream side and the downstream side of the component mounter 14 is not delayed during the execution of the production process by production line 10. Hereinafter, a production device excluding component mounter 14 of multiple production devices constituting production line 10 will also be referred to as a "mounting-related machine". The mounting-related machines of production line 10 in the present embodiment correspond to printer 11, print inspection device 12, buffer device 13, appearance inspection device 15, reflow oven 16, and functional tester 17.

Here, if the cycle time is increased by some factor in any of the production devices during the production of the board product by production line 10, the line balance may deteriorate. In particular, if the cycle time is increased in a bottleneck process in which the cycle time is the maximum of the mounting processes executed by multiple production devices, the conveyance of the board is delayed and the production efficiency is lowered. Therefore, it is preferable that production line 10 has a device configuration in which the line balance is properly maintained during the production of the board product.

Optimization device 50 applied to production line 10 optimizes the device configuration when the device configuration of production line 10 is newly designed, or when the device configuration is changed from an existing state in order to change the product type or improve the production efficiency, for example. In the present embodiment, as shown in FIG. 1, an embodiment in which optimization device 50 is incorporated in the host PC is illustrated.

1-4. Configuration of Optimization Device 50

As shown in FIG. 1, optimization device 50 includes memory section 51, cycle time setting section 52, target time setting section 53, and line design section 54. Memory section 51 is configured by a hard disk, a flash memory, or the like. Memory section 51 stores setting data such as production plan M1, product information M2, cycle time information M3 of the mounting-related machine, and the like.

Figure 2:
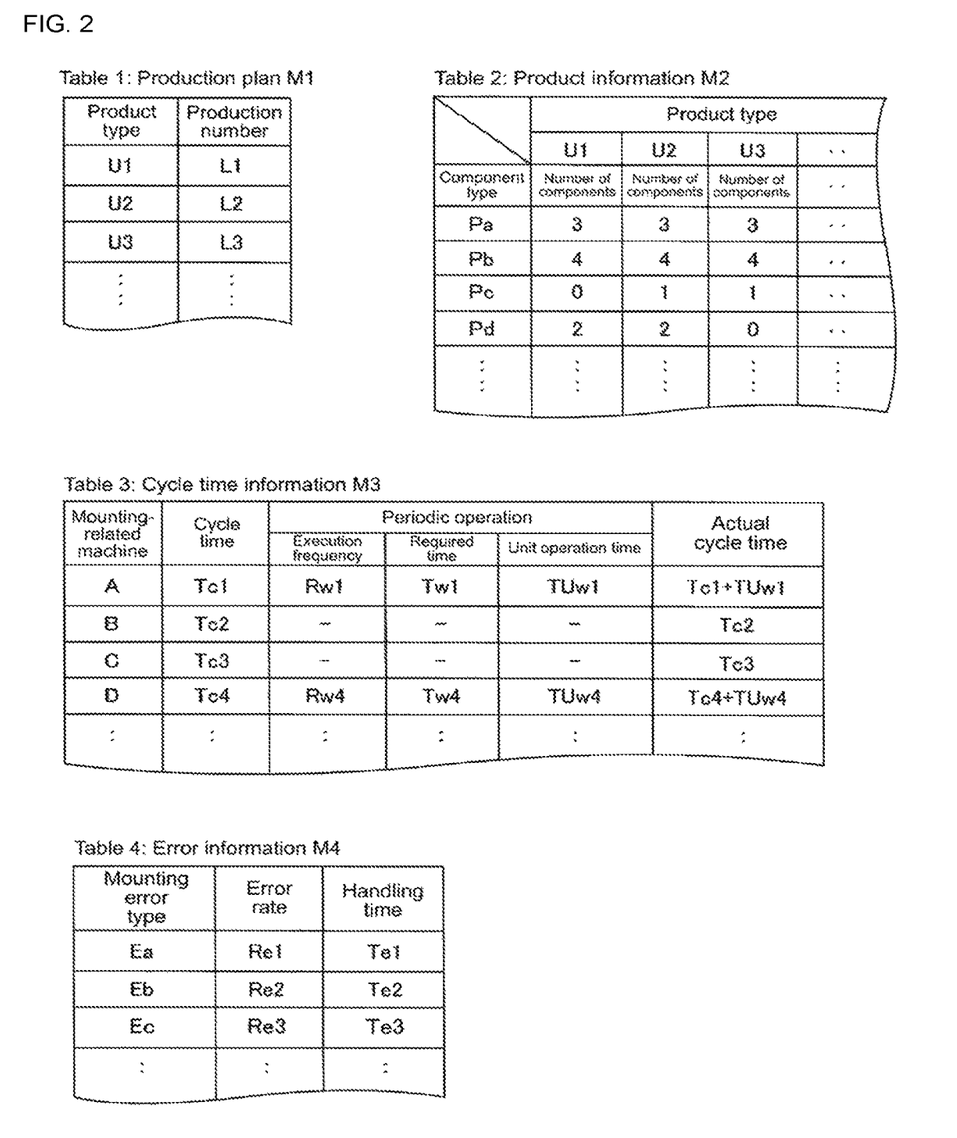
FIG. 2 is a view showing various data stored in a memory section.

As shown in Table 1 of FIG. 2, production plan M1 is information indicating the target production number (L1, L2, L3, . . . ) for each product type (U1, U2, U3, . . . ). As shown in Table 2 of FIG. 2, product information M2 is information in which the component types (Pa, Pb, Pc, Pd, . . . ) required for the production of the board product and the number of components are recorded for each product type (U1, U2, U3, . . . ). In other words, product information M2 indicates, for each component type, the number of components consumed when one board product of a predetermined product type is produced.

Cycle time information M3 of the mounting-related machine is information indicating a cycle time (Tc1, Tc2, Tc3, Tc4, . . . ), information related to a periodic operation, and the like for each of the mounting-related machines (A, B, C, D, . . . ). Each of the mounting-related machines (A, B, C, D, . . . ) corresponds to, for example, printer 11, print inspection device 12, appearance inspection device 15, reflow oven 16, and the like. Since buffer device 13 is configured to convey the board in response to requests from the preceding and following production devices, the cycle time is set to 0 and is not included in cycle time information M3.

Each of the cycle times (Tc1, Tc2, Tc3, Tc4, . . . ) of the mounting-related machines is a required time per one board of the production process (such as printing process and inspection process) executed by each of the mounting-related machines in accordance with the respective functions. The cycle time of the mounting-related machine is set by cycle time setting section 52. Cycle time setting section 52 sets a cycle time for each production device. Here, the "setting" of the cycle time includes a case where the parameter input by the user of optimization device 50 is used as the cycle time, and a case where the estimated value calculated based on various information is used as the cycle time.

In the present embodiment, the cycle time (Tc1, Tc2, Tc3, Tc4, . . . ) of the mounting-related machine is set by accepting inputs of parameters by the user of optimization device 50. Optimization device 50 may assist the input of the parameter by displaying the average value of the cycle times of the respective production processes based on the past performance information when the user input is received as described above. In addition, the cycle time setting section may calculate the cycle time of each mounting-related machine relating to the board product to be produced based on the past performance information, production plan M1, and product information M2.

Target time setting section 53 sets a target time as an index when calculating the unit number of component mounters 14 constituting production line 10. Here, as the unit number of component mounters 14 constituting production line 10 increases, the unit number of components to be mounted on the board by the mounting process of one component mounter 14 decreases, and the cycle time is shortened. However, even if the unit number of component mounters 14 is excessively increased, waiting for the board to be loaded from the production device on the upstream side or component mounter 14 waiting for the board to be unloaded due to the production device on the downstream side being unable to accept the board occurs, resulting in a state in which the production efficiency reaches the upper limit. In such a state, production line 10 becomes unnecessarily long, and the production function and the facility cost become excessive.

Therefore, optimization device 50 sets a target time as an index indicating how long the cycle time of component mounter 14 should be to design an optimal device configuration. Conventionally, for example, the target time is set to the maximum time of the cycle times of each of the multiple mounting-related machines from the above-described point of view. Thus, the production process executed at the maximum cycle time is referred to as the bottleneck process in production line 10.

In the present embodiment, target time setting section 53 sets the target time based on the cycle time (Tc1, Tc2, Tc3, Tc4, . . . ) and the time required for the periodic operation (Tw1, Tw4, . . . ) in each of the multiple mounting-related machines. Here, at least a portion of the mounting-related machines execute a periodic operation accompanied by stopping the conveyance of the board at a predetermined execution frequency between successive production processes. This periodic operation includes cleaning and solder replenishment performed by printer 11 as described above.

In cycle time information M3, as shown in Table 3 of FIG. 2, for each of the mounting-related machines (A, B, C, D, . . . ), the execution frequency of the periodic operation (Rw1, –, –, Rw4, . . . ), the required time (Tw1, –, –, Tw4, . . . ), and the unit operation time (TUw1, –, –, TUw4, . . . ) are set in advance. In addition, in the case where the periodic operation is not executed among the mounting-related machines, or in the case where the production efficiency is not affected by circumstances such as a very low execution frequency even if the periodic operation is executed, the execution frequency, the required time, and the unit operation time of the periodic operation are not set as in some mounting-related devices (B, C).

When multiple types of periodic operation can be executed as in the case of printer 11, the frequency of execution of the multiple types of periodic operation and the required time may be respectively set (only one type is shown in Table 3 of FIG. 2). The frequency of execution of the periodic operation and the required time are parameters input by the user of optimization device 50. Optimization device 50 may assist the input of the parameter by displaying the past execution frequency and the average value of the actual required time based on the past performance information when the user input is received as described above.

Also, the unit operation time (TUw1, –, –, TUw4, . . . ) is defined herein as the time required for periodic operation per one board calculated based on the execution frequency of periodic operation (Rw1, –, –, Rw4, . . . ). Further, the execution frequency of the periodic operation may be set not only by the number of boards corresponding to the number of executions of the production process, but also by a time elapsed from the end of the previous periodic operation, or may be set such as when the constituent members of the mounting-related machine have moved a defined count number or a defined distance.

For example, when the execution frequency of the periodic operation is set by the number of boards, the unit operation time (TUw1) corresponds to a value (TUw1=Tw1/Rw1) obtained by dividing the required time (Tw1) by the execution frequency (Rw1). Specifically, in the case where the cleaning of printer 11 is performed once for every 20 sheets of printing process and it takes 120 seconds to perform the cleaning once, the unit operation time becomes 6 (seconds) by 120 seconds/20 sheets.

Target time setting section 53 sets the target time as the maximum of the sum of the cycle time (Tc1, Tc2, Tc3, Tc4, . . . ) and the unit operation time (TUw1, –, –, TUw4, . . . ) of the mounting-related machine when the required time for the periodic operation per one board is defined as the unit operation time as described above. For example, as shown in Table 3 of FIG. 2, when the maximum time of the respective sums (Tc1+TUw1, Tc2, Tc3, Tc4+TUw4, . . . ) is Tc1+TUw1, this maximum time is set as the target time.

Line design section 54 calculates the unit number of component mounters 14 constituting production line 10 based on the set target time. Various modes are assumed for the unit number calculation processing of component mounters 14 based on the target time by line design section 54. Details of the unit number calculation processing will be described later. In addition, in the present embodiment, line design section 54 determines whether buffer device 13 is required for production line 10, and calculates the capacity required for buffer device 13 when buffer device 13 is required. Details of the necessity determination of buffer device 13 and the capacity calculation processing by line design section 54 will be described later.

1-5. Optimization Process of Production Line 10

The optimization process of production line 10 by the above-described optimization device 50 will be described with reference to FIGS. 2 to 7. Optimization device 50 executes the optimization process of production line 10 when the device configuration of production line 10 is newly designed or when the device configuration of production line 10 is changed. Here, based on production plan M1 and product information M2, the type of the production device necessary for production line 10 is determined in advance.

Figure 3:
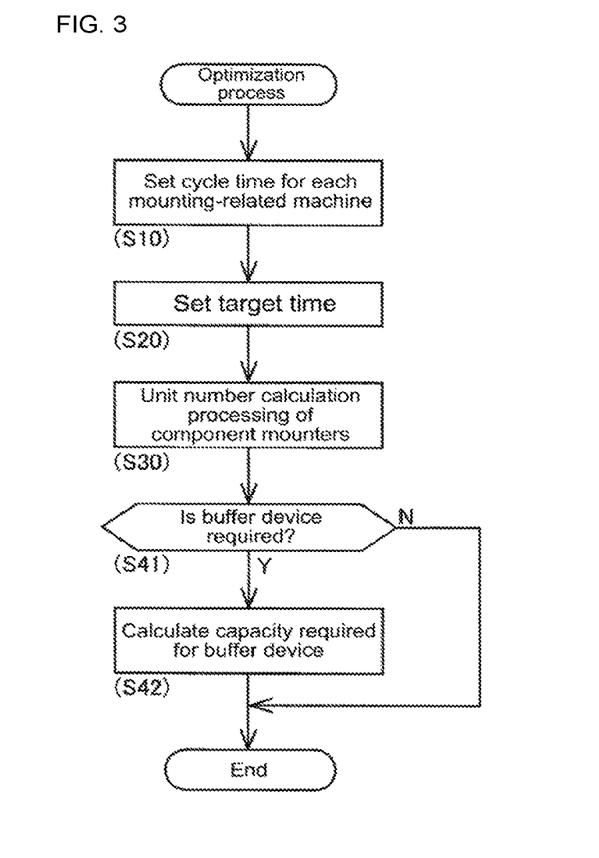
FIG. 3 is a flowchart showing an optimization process of a production line by an optimization device.

First, as shown in FIG. 3, cycle time setting section 52 sets a cycle time for each of multiple production devices (mounting-related machines) except for component mounter 14 (step 10 [hereinafter, "step" is referred to as "S"]). Cycle time setting section 52 receives inputs by the user as required, and sets cycle times (Tc1, Tc2, Tc3, Tc4, . . . ) for each of the mounting-related machines (A, B, C, D, . . . ), as shown in Table 3 of FIG. 2.

Next, in S20, target time setting section 53 executes a target time setting process. Specifically, target time setting section 53 sets the target time based on the cycle time (Tc1, Tc2, Tc3, Tc4, . . . ) and the time required for periodic operation (Tw1, –, –, Tw4, . . . ) of each of the mounting-related machines.

Here, it is possible to freely set how much the time required for the periodic operation is reflected in the target time. That is, even if the time required for the periodic operation is 120 seconds as an actual result, when the degree of influence of the time required for the periodic operation is set to 80% at the time of setting the target time, the time required for the periodic operation is set to 96 seconds and used for setting the target time. In the present embodiment, the required time for the periodic operation is fully reflected as described below, and the calculation accuracy of the target time is improved.

Specifically, target time setting section 53 calculates the sum of the cycle time (Tc1, Tc2, Tc3, Tc4, . . . ) and the unit operation time (TUw1, –, –, TUw4, . . . ) in each of the mounting-related machines as the actual cycle time. Target time setting section 53 sets the maximum time of the actual multiple substantial cycle times as the target time. The unit operation time is calculated in advance based on the execution frequency of the periodic operation and the required time after being set. Target time setting section 53 may accept editing of the execution frequency of the periodic operation and the required time by the user as necessary at the time of setting the target time, update the unit operation time, and set the target time again.

Here, it is assumed that the production device that executes the production process at the time set to the target time as described above is printer 11 that executes the printing process as the production process. The periodic operation in printer 11 includes cleaning and replenishing of solder performed every time a predetermined number of boards are printed, and execution frequency Rw1 and required time Tw1 are set. target time setting section 53 sets the sum (Tc1+TUw1) of the cycle time and the unit operation time in target time Tg (Tg=Tc1+TUw1).

Next, line design section 54 executes unit number calculation processing for setting the unit number of component mounters 14 constituting production line 10 based on target time Tg (S30). Line design section 54 can apply multiple types of modes as the unit number calculation processing. Here, three types of modes of the unit number calculation processing will be given as examples.

1-5-1. First Mode of Unit Number Calculation Processing

Figure 4:
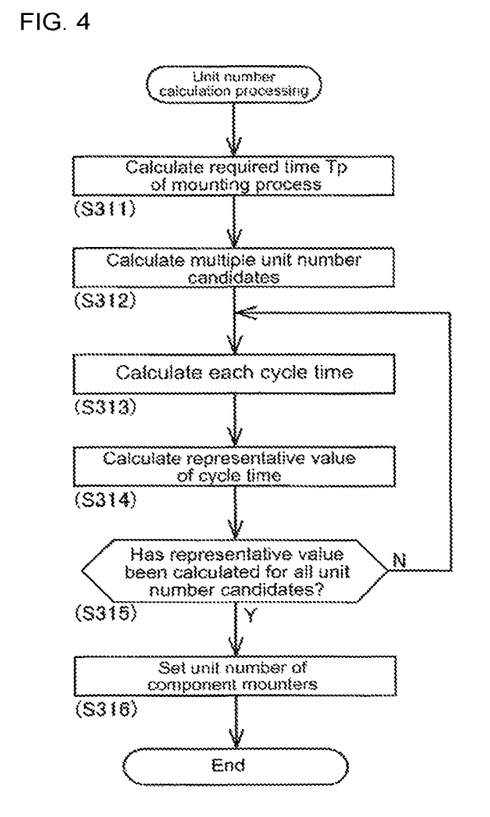
FIG. 4 is a flowchart showing a first mode of the unit number calculation processing in FIG. 3.

In the first mode of the unit number calculation processing, as shown in FIG. 4, line design section 54 first assumes that one component mounter 14 mounts all the components, and calculates required time Tp of the mounting process (S311). Next, line design section 54 calculates the multiple unit number candidates based on calculated required time Tp and target time Tg (S312).

Specifically, for example, assuming that three types of the unit number candidates (N1, N2, N3) are calculated, line design section 54 sets a value rounded up the decimal point or less of the value (Tp/Tg) obtained by dividing required time Tp by target time Tg as first candidate N1, sets a value obtained by rounding down the decimal point or less as second candidate N2, and sets a value obtained by subtracting 1 from second candidate N2 as third candidate N3. More specifically, if required time Tp is 320 seconds and target time Tg is 50 seconds, the number of first candidate N1 rounded up to the decimal point is seven. Then, the number of second candidate N2 rounded down to the decimal point is six, and the number of third candidate N3 obtained by subtracting one from second candidate N2 is five.

Next, cycle time setting section 52 calculates the cycle time of component mounter 14 on the assumption that the mounting process is executed on one of the unit number candidates by component mounter 14 including the number candidate (S313). Next, line design section 54 calculates representative values of the calculated cycle times (S314). Here, the representative value of the cycle time is an average value or a maximum value of the cycle time in each of multiple component mounters 14. For example, in the case of first candidate N1, when the mounting of all the components is virtually equally divided into seven component mounters 14, representative value Vr1 is a value (Tp/7) obtained by dividing required time Tp by first candidate N1, that is, an average value of the cycle time.

On the other hand, when the mounting of all the components is realistically averaged and unequally distributed to seven component mounters 14, representative value Vr1 is the largest value of the cycle time required for the bottleneck process in multiple component mounters 14, that is, the maximum value of the cycle time. The representative value of the cycle time can be freely set to either the average value or the maximum value. When the representative value (Vr1, Vr2, Vr3) of the cycle time has not been calculated for all the unit number candidates (N1, N2, N3) (S315: No), line design section 54 repeats the calculation (S313) of the cycle time and the calculation (S314) of the representative value.

On the other hand, when the representative value (Vr1, Vr2, Vr3) of the cycle time is calculated for all the unit number candidates (N1, N2, N3) (S315: Yes), line design section 54 sets the number candidate of component mounters 14 whose representative value is smaller than target time Tg and the difference between the representative value and target time Tg is the smallest as the unit number of component mounters 14 constituting production line 10 (S316).

Figure 5:
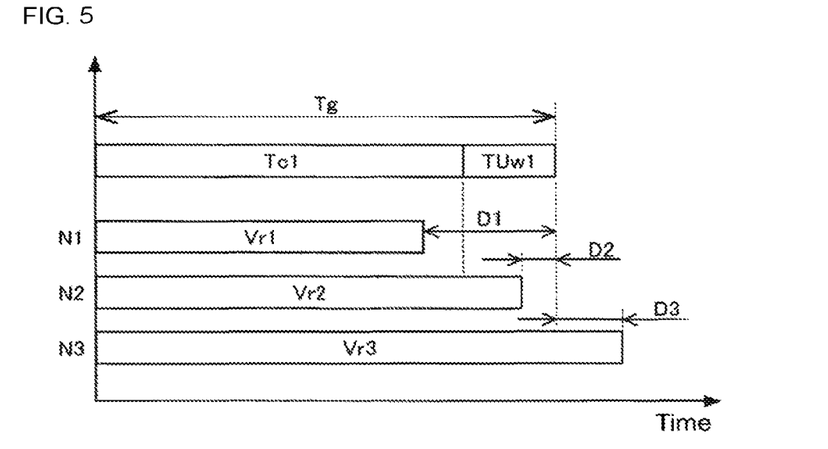
FIG. 5 is a graph showing a relationship between a representative value of a cycle time for each unit number of candidates corresponding to the first mode of the unit number calculation processing and a target time.

Specifically, as shown in FIG. 5, the larger the value of the unit number candidates (N1, N2, N3), the smaller the representative value (Vr1, Vr2, Vr3) becomes. First, third candidates N3 whose representative values Vr3 are not smaller than target time Tg are excluded. Since the magnitude correlation of difference D1 between representative value Vr1 of first candidate N1 and target time Tg, and difference D2 between representative value Vr2 of second candidate N2 and target time Tg is D2<D1, line design section 54 sets second candidate N2 corresponding to difference D2 as the unit number of component mounters 14. That is, according to the above example, the number of component mounters 14 is set to six. With such a configuration, it is possible to reliably suppress an excessive unit number of component mounters 14. As a result, the cost required for constructing production line 10 is curtailed.

According to the above-described configuration, it is possible to configure a device having a process capacity closest to the mounting-related machine in consideration of the time required for the periodic operation. In S316, line design section 54 may set the unit number candidates of component mounter 14 in which the difference (D1, D2, D3) between the representative value (Vr1, Vr2, Vr3) and target time Tg is minimized regardless of whether the representative value (Vr1, Vr2, Vr3) is less than target time Tg. In the above example, although the result is unchanged because the magnitude correlation of the respective differences (D1, D2, D3) is D2<D3<D1, third candidate N3 may be set as the unit number of component mounters 14 even if representative value Vr3 of third candidate N3 is larger than target time Tg (Vr3>Tg) when the magnitude correlation is D3<D2<D1, for example. With such a configuration, it is possible to construct production line 10 having a suitable line balance.

1-5-2. Second Mode of Unit Number Calculation Processing

Figure 6:
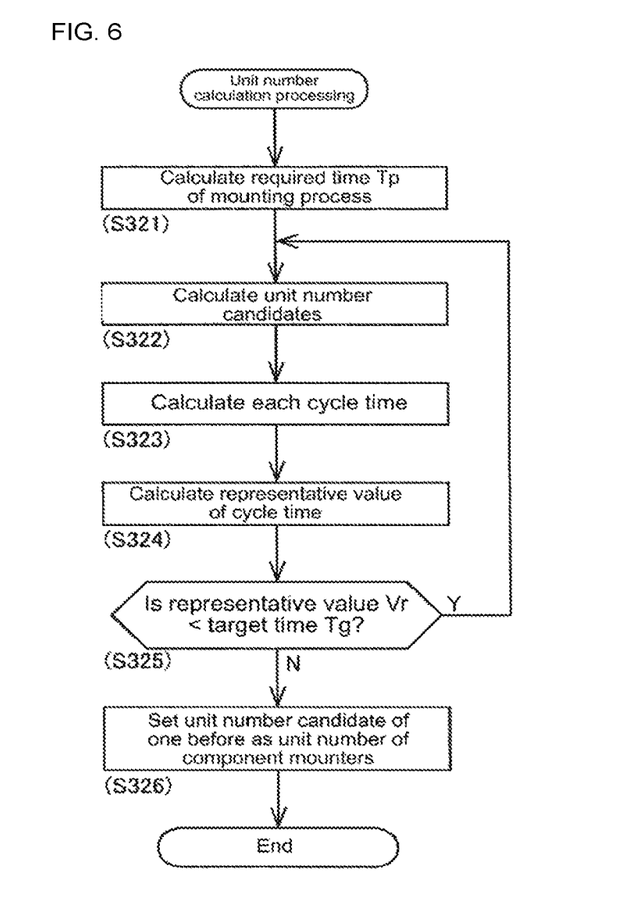
FIG. 6 is a flowchart showing a second mode of the unit number calculation processing in FIG. 3.

In the second mode of the unit number calculation processing, as shown in FIG. 6, line design section 54 first assumes that one component mounter 14 mounts all components, and calculates required time Tp of the mounting process (S321). Next, line design section 54 calculates first candidate N1 as a first candidate for the unit number of lines based on calculated required time Tp and target time Tg (S322).

Specifically, line design section 54 calculates, as first candidate N1, a value obtained by rounding up a decimal point or less of a value (Tp/Tg) obtained by dividing required time Tp by target time Tg, for example. Next, cycle time setting section 52 calculates the cycle time of component mounter 14 on the assumption that the mounting process is executed in component mounter 14 including the unit number of first candidates N1 (S323). Next, line design section 54 calculates representative value Vr1 of the calculated cycle time (S324). Line design section 54 determines whether representative value Vr1 is smaller than target time Tg (S325).

When representative value Vr1 is smaller than target time Tg (S325: Yes), line design section 54 calculates the number obtained by subtracting one from the unit number of first candidates N1 as second candidate N2 (S322), and calculates the cycle time of component mounter 14 (S323) and representative value Vr2 of the cycle time (S324) on the assumption that the mounting process is executed in component mounter 14 including the unit number of second candidates N2. Then, line design section 54 determines whether representative value Vr2 is smaller than target time Tg (S325). In this manner, the calculation of the unit number candidates (S322), the calculation of the cycle time (S323), the calculation of the representative value (S324), and the comparison with target time Tg (S325) are repeated.

Then, for example, when it is determined that representative value Vr3 of third candidate N3 is not smaller than target time Tg (S325: No), line design section 54 sets the number candidate one before third candidate N3, that is, second candidate N2 as the unit number of component mounters 14 (S326). According to the above example, six component mounters 14 are set. As described above, in the second mode of the unit number calculation processing, the calculation (S324) of representative value Vr of the cycle time and the comparison of representative value Vr and target time Tg (S325) are repeated as sets. As a result, the calculation load of representative value Vr can be reduced as compared with the first mode in which representative value Vr is calculated in advance for all of the unit number candidates.

1-5-3. Third Mode of Unit Number Calculation Processing

Figure 7:
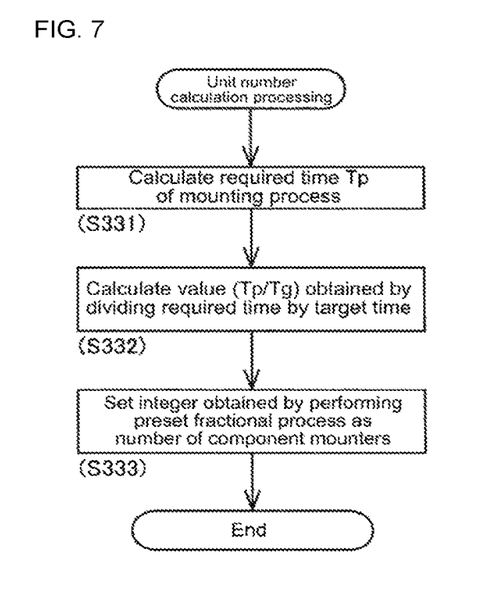
FIG. 7 is a flowchart showing a third mode of the unit number calculation processing in FIG. 3.

In the third mode of the unit number calculation processing, line design section 54 calculates the unit number of component mounters 14 without calculating multiple unit number candidates as in the first mode and the second mode. Specifically, as shown in FIG. 7, line design section 54 first assumes that component mounter 14 mounts all the components in one unit, and calculates required time Tp of the mounting process (S331). Next, line design section 54 calculates a value (Tp/Tg) obtained by dividing calculated required time Tp by target time Tg (S332).

Line design section 54 sets a value obtained by performing a preset fractional process on this value (Tp/Tg) to be an integer as the unit number of multiple component mounters 14 constituting production line 10 (S333). Incidentally, the above-described fractional process includes rounding up, rounding down, rounding off, and the like after the decimal point. When the unit number of components is set by rounding up in the fractional process, the cycle time in each of multiple component mounters 14 reliably falls below target time Tg, while the difference between target time Tg and the cycle time becomes larger than other candidates.

When the unit number of components is set by rounding down in the fractional process, the cycle time of each of multiple component mounters 14 is less than target time Tg, and the unit number of component mounters 14 can be set to be smaller than other candidates. When the unit number of components is set by rounding off the fractional process, the difference between target time Tg and the cycle time can be reduced although the cycle time in each of multiple component mounters 14 is not necessarily lower than target time Tg.

As shown in FIG. 3, after the unit number of component mounters 14 constituting production line 10 is calculated by the unit number calculation processing (S30) as described above, line design section 54 determines whether buffer device 13 is required for production line 10 (S41). Here, a production device that maximizes the sum of the cycle time (Tc1, Tc2, Tc3, Tc4, . . . ) and the unit operation time (TUw1, –, –, TUw4, . . . ) of multiple production devices (mounting-related machines) excluding component mounter 14 is referred to as a first production device. When representative value Vr of the cycle time in multiple component mounters 14 is larger than the cycle time of the first production device, line design section 54 determines that buffer device 13 having a predetermined capacity is required between the first production device and component mounter 14 in production line 10 (S41: Yes).

As described above, when the unit number of component mounters 14 is calculated based on target time Tg set in consideration of the required time Tw1 for the periodic operation (S10 to S30), the cycle time of multiple component mounters 14 may be longer than cycle time Tc1 of the bottleneck process. In this case, in the period between the periodic operation and the periodic operation, the conveyance of the board between the first production device (printer 11) which executes the bottleneck process and component mounter 14 is delayed. Therefore, in the case as described above, line design section 54 determines that buffer device 13 is required (S41: Yes).

Specifically, in the above-described examples, the first production device is printer 11 (mounting-related machine A), and when the unit number of component mounters 14 is set to six in the unit number calculation processing (S30), as shown in FIG. 5, when representative value Vr2 of the cycle time is larger than cycle time Tc1 of printer 11 (mounting-related machine A) (Vr2>Tc1), line design section 54 determines that buffer device 13 is required (S41: Yes).

As a result, when buffer device 13 is installed between the first production device (printer 11) and component mounter 14, the number of boards held in buffer device 13 gradually increases during the period in which the periodic operation is not executed, and the number of boards held in buffer device 13 gradually decreases during the period in which the periodic operation is executed. In any period, the delay of the conveyance of the board in production line 10 is prevented, and the production efficiency can be maintained.

When the first production device is on the downstream side of component mounter 14, buffer device 13 is installed between component mounter 14 and the first production device. In such a configuration, the number of boards held in buffer device 13 gradually decreases during a period in which the periodic operation is not executed in the first production device, and the number of boards held in buffer device 13 gradually increases during a period in which the periodic operation is executed. In any period, delay of the conveyance of the board in production line 10 is prevented.

Line design section 54 calculates a predetermined capacity required for buffer device 13 (S42). Specifically, line design section 54 calculates a predetermined capacity required for buffer device 13 based on the difference (Vr2-Tc1) between representative value Vr2 of the cycle time in multiple component mounters 14 and cycle time Tc1 of printer 11 (mounting-related machine A) and execution frequency Rw1 of the periodic operation in printer 11 (mounting-related machine A). More specifically, the predetermined capacity is calculated as follows.

Here, it is assumed that cycle time Tc1 of the printing process by printer 11 is 50 seconds, the periodic operation is executed every 20 sheets, the required time Tw1 takes 120 seconds, and representative value Vr2 of the cycle time of multiple component mounters 14 is 55 seconds. Then, printer 11 takes 1,000 seconds to execute the printing process on 20 sheets, and then performs the periodic operation for 120 seconds. Component mounter 14 executes the mounting process on approximately 18.2 sheets until 1,000 seconds have elapsed from the end of the previous periodic operation. That is, component mounter 14 is in a state in which the 19th board is carried in at the point in time when 1,000 seconds have elapsed.

Therefore, buffer device 13 provided between printer 11 and component mounter 14 need only be capable of holding at least one sheet corresponding to the difference in the number of processes. That is, line design section 54 calculates the predetermined capacity required for buffer device 13 as one. On the other hand, if the difference (Vr2-Tc1) between representative values Vr2 of the cycle time in multiple component mounters 14 and cycle time Tc1 of printer 11 (mounting-related machine A) is large, or if execution frequency Rw1 of the periodic operation is low, a larger capacity is required for buffer device 13.

By appropriately calculating the capacity of buffer device 13 as described above, it is possible to reduce the excess and deficiency of the capacity of buffer device 13 when production line 10 is configured by the calculated unit number of component mounters 14. Therefore, delay of the conveyance of the board due to the execution of the periodic operation is reliably prevented.

In S41, when component mounter 14 is set to first candidate N1 in the unit number calculation processing (S30) and representative value Vr1 of the cycle time is smaller than cycle time Tc1 of printer 11 (mounting-related machine A) (Vr1<Tc1), line design section 54 determines that buffer device 13 is not required (S41: No). This is a result based on the fact that the process capacity of multiple component mounters 14 is high, and it is estimated that the delay of the conveyance of the board is prevented in the period between the periodic operation in printer 11 (mounting-related machine A).

1-6. Effects of Configuration of First Embodiment

According to optimization device 50, the unit number of component mounters 14 is calculated based on target time Tg set in consideration of the time required for the periodic operation (S30). Conventionally, a cycle time of a bottleneck process in a mounting-related machine is simply set as a target time.

On the other hand, optimization device 50 of the present embodiment sets target time Tg in which the required time of the periodic operation is counted, on the assumption that the required time of the periodic operation may be a factor for delaying the conveyance of the board (S20). By using such a target time Tg for calculation of the unit number of component mounters 14, the excess and deficiency of the process capacity in multiple component mounters 14 can be reduced even if the periodic operation is executed. Therefore, optimization device 50 can optimize the device configuration in the production line adapted to actual production.

2. Second Embodiment 2-1. Overview of Production Line Optimization Device 50

Optimization device 50 of the second embodiment differs mainly in the calculation processing (S313 of FIG. 4, S323 of FIG. 6) of the cycle time in the unit number calculation processing (S30) in the optimization process of the first embodiment. Since the cycle time is increased when a mounting error occurs in the mounting process, optimization device 50 optimizes the device configuration of production line 10 by considering the handling time of the mounting error on the assumption that the mounting error periodically occurs. Since other common configurations are substantially the same as those of the first embodiment, detailed description thereof will be omitted.

As shown in FIG. 1 and Table 4 of FIG. 2, error information M4 is stored in memory section 51. In error information M4, an error rate (Re1, Re2, Re3, . . . ) and a handling time (Te1, Te2, Te3, . . . ) are set for each type (Ea, Eb, Ec, . . . ) of the mounting error, assuming that the mounting error occurs at a predetermined error rate in production line 10 to be constructed in the optimization process.

The types of mounting errors (Ea, Eb, Ec, . . . ) include, for example, the appropriateness of a component, a deviation of a mounting position or a mounting angle, and are classified into component types. The error rate (Re1, Re2, Re3, . . . ) of the mounting error indicates a value indicating the frequency of the mounting error, and differs depending on the type of the mounting error. For example, one error rate corresponds to a frequency at which a mounting error such as a deviation of a mounting position beyond a prescribed value occurs when mounting of a certain component type is attempted. The handling time (Te1, Te2, Te3, . . . ) corresponds to an extension time of a required time (cycle time) of the mounting process, which is extended when the mounting error occurs in the mounting process by component mounter 14, in accordance with the execution of the error handling according to the mounting error.

Specifically, it is assumed that a mounting error occurs in which a component is not mounted because the component is not properly supplied in the mounting process. In such a case, as a countermeasure against an error corresponding to the mounting error, a recovery processing for attempting to mount the component again in the next pick-and-place cycle or later is executed. When the recovery processing as described above is executed, the movement amount of the mounting head accompanying the pick up of the component and the mounting on the board increases, and the pick-and-place cycle may also increase. In this manner, the time extended with respect to the predetermined cycle time corresponds to the handling time of the mounting error.

The error rate (Re1, Re2, Re3, . . . ) and the handling time (Te1, Te2, Te3, . . . ) in error information M4 are set by accepting inputs of parameters by the user of optimization device 50. Optimization device 50 may assist the input of the parameter by displaying the average value of the error rate of each mounting error and the average value of the handling time based on the past performance information when accepting the input of the user as described above. Optimization device 50 may calculate the error rate and the handling time of each mounting error relating to the board product to be produced based on the past performance information, production plan M1, and product information M2.

Figure 8:
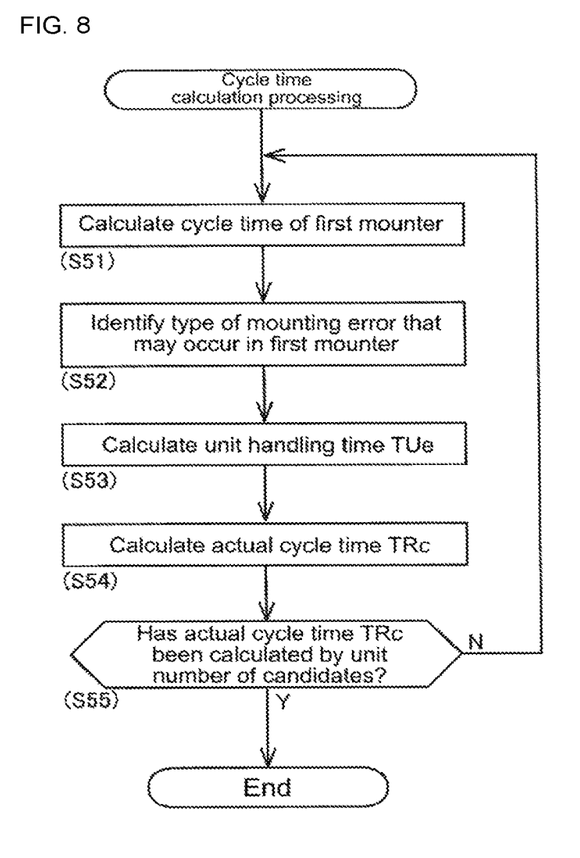
FIG. 8 is a flowchart showing a representative value calculation processing of an optimization process in a second embodiment.

2-2. Calculation of Cycle Time in Unit Number Calculation Processing of Optimization Process As shown in FIG. 8, cycle time setting section 52 calculates the cycle time of first component mounter 14 (hereinafter, referred to as "first mounter") of multiple component mounters 14 on the assumption that the mounting process is executed by component mounter 14 composed of the unit number of the candidates (for example, first candidate N1) (S51). This cycle time corresponds to best cycle time TBc per one board when no mounting error occurs.

Next, cycle time setting section 52 identifies the type of mounting error that may occur in the first mounter, based on the type of the component allocated to the first mounter and error information M4 (S52). Subsequently, cycle time setting section 52 calculates a handling time per one board (hereinafter referred to as "unit handling time TUe") calculated based on the error rate (Re1, Re2, Re3, . . . ) of error information M4 (S53).

Here, it is assumed that the number of pieces of component type Pa allocated to the first mounter is three, error rate Re1 of mounting error Ea related to component type Pa is 0.01%, and the handling time of mounting error Ea is 2 seconds on the average. Cycle time setting section 52 calculates the handling time of component type Pa per one board as 0.06 seconds, which is the product of these. Then, the handling time calculated for each mounting error corresponding to the component type is summed up as unit handling time TUe. For example, when the mounting error handling time for one type of component is 0.04 seconds on average and 30 component types are allocated to be mounted, unit handling time TUe is 1.2 seconds.

Next, cycle time setting section 52 adds unit handling time TUe of the first mounter to best cycle time TBc of the first mounter calculated in S51 (TBc+TUe), and calculates actual cycle time TRc in consideration of the handling time of the mounting error (S54). Cycle time setting section 52 repeats the above-described process (S51 to S54) when actual cycle time TRc has not been calculated by the unit number of candidates (S55: No).

When actual cycle time TRc is calculated by the unit number of candidates (S55: Yes), cycle time setting section 52 ends the cycle time calculation processing. Thereafter, multiple actual cycle times TRc calculated by cycle time setting section 52 are used as a cycle time to calculate (S314, S324) representative values Vr by line design section 54. The other processes are the same as that of the first embodiment, and therefore detailed description thereof is omitted.

It is possible to freely set how much the error handling time is to be included in the cycle time. That is, even if the error handling time is 2 seconds as a result, when the degree of influence of the error handling time is set to 80% at the time of calculating the cycle time, the required time of the error handling is set to 1.6 seconds and used for setting the cycle time. In the present embodiment, as described above, the entire time required for the error handling is reflected, and the accuracy of calculation of actual cycle time TRc is improved.

2-3. Effects of Configuration of Second Embodiment

According to optimization device 50, the unit number of component mounters 14 is calculated based on the cycle time of the component mounter in consideration of the error handling time for the mounting error (S30). Conventionally, the best cycle time at which no mounting error occurs in component mounter 14 is simply set as the cycle time of component mounter 14.

On the other hand, optimization device 50 of the present embodiment calculates actual cycle time TRc of component mounter 14 on the assumption that the error handling time may be a factor for delaying the conveyance of the board (S54). By using such a cycle time for calculation of the unit number of component mounters 14, even if error handling is executed, the excess and deficiency of the process capacity in multiple component mounters 14 can be reduced. Therefore, optimization device 50 can optimize the device configuration in the production line adapted to actual production.

3. Modifications of First and Second Embodiments 3-1. Unit Number Calculation Processing In the first embodiment, target time Tg is calculated in consideration of the time required for the periodic operation in the mounting-related machine, and the unit number of component mounters 14 is calculated based on target time Tg. As a result, even when the periodic operation is executed in the mounting-related machine, the unit number of multiple component mounters 14 constituting production line 10 is adjusted so as not to become excessive functionally.

On the other hand, in the second embodiment, actual cycle time TRc is calculated in consideration of the error handling time for the mounting error, and target time Tg is set based on actual cycle time TRc. As a result, even if mounting errors occur in multiple component mounters 14 constituting production line 10, the unit number of components is adjusted so that multiple component mounters 14 constituting production line 10 are not functionally insufficient.

On the other hand, optimization device 50 of production line 10 may be configured to optimize the device configuration of production line 10 in consideration of only the handling time of the mounting error, out of the time required for the periodic operation and the handling time of the mounting error. At this time, in the target time setting process (S20), target time setting section 53 sets, for example, the maximum time (cycle time of bottleneck process) of the cycle times in each of the multiple mounting-related machines to target time Tg. With such a configuration, the same effect as that of the second embodiment can be obtained.

Here, as described above, when actual cycle time TRc of component mounter 14 is set in consideration of the handling time of the mounting error, the cycle time becomes shorter than scheduled in the period in which the mounting error does not occur in component mounter 14. On the other hand, when a mounting error occurs in component mounter 14, the cycle time is increased. As a result, the conveyance of the board between the production device (hereinafter referred to as "second production device") for executing the bottleneck process and component mounter 14 of the multiple production devices (mounting-related machines) excluding component mounter 14 is stagnant, and the production process becomes a standby state, and the production efficiency may be lowered.

Therefore, in the case as described above, line design section 54 determines that buffer device 13 is required between the second production device and component mounter 14. As a result, when the second production device is on the upstream side (or the downstream side) of component mounter 14 and buffer device 13 is installed between the second production device and component mounter 14, the boards held in buffer device 13 gradually decrease (increases) during the period in which the mounting error does not occur, and the boards held in buffer device 13 gradually increase (decrease) during the period in which the mounting error occurs and the error handling is executed. In any period, the stagnation of the conveyance of the board in production line 10 is prevented, and the production efficiency can be maintained.

Further, line design section 54 calculates a predetermined capacity required for buffer device 13 based on a difference between a representative value of actual cycle time TRc in multiple component mounters 14 and the cycle time of the second production device, and an error rate in multiple component mounters 14. With such a configuration, when buffer device 13 is installed between the second production device and component mounter 14, it is possible to reduce the excess and deficiency of the capacity of buffer device 13. Therefore, the stagnation of the conveyance of the board can be more reliably prevented by the execution of the error handling.

3-2. Others

In the first and second embodiments, optimization device 50 of production line 10 is incorporated in the host PC. On the other hand, optimization device 50 may be an external device of the host PC. For example, optimization device 50 may be configured as multiple production devices constituting the existing production line 10 and a dedicated device communicably connected to the host PC.

REFERENCE SIGNS LIST

10: production line; 11: printer; 12: print inspection device; 13: buffer device; 14: component mounter; 15: appearance inspection device; 16: reflow oven; 17: functional tester; 50: optimization device; 51: memory section; 52: cycle time setting section; 53: target time setting section; 54: line design section; M1: production plan; M2: product information; M3: cycle time information; M4: error information

The invention claimed is:

1. An optimization device for a production line in which multiple production devices each execute a production process, the multiple production devices including multiple component mounters each configured to mount components on a circuit board by conveying the circuit board along the production line as the production process, at least a portion of the multiple production devices excluding the component mounters each executing a periodic operation accompanied by a stop of conveyance of the circuit board at a predetermined execution frequency during successive of the production processes, the optimization device comprising:
a cycle time setting section configured to set a cycle time for each production device;
a target time setting section configured to set a target time based on the cycle time and a required time for the periodic operation in each of the multiple production devices excluding the component mounters, and
a line design section configured to calculate the unit number of the component mounters constituting the production line based on the target time.

2. The optimization device for production line according to claim 1,
wherein, when the required time for the periodic operation per one circuit board calculated based on the execution frequency of the periodic operation is defined as a unit operation time, the target time setting section is configured to set a maximum time of a sum of the cycle time and the unit operation time in each of the multiple production devices excluding the component mounters as the target time.

3. The optimization device for production line according to claim 2,
wherein the line design section is configured to calculate, as the unit number of the component mounters constituting the production line, the unit number of the component mounters for which a representative value, which is an average value or a maximum value of the cycle time in the multiple component mounters, is smaller than the target time and a difference between the representative value and the target time is minimized, or the unit number of the component mounters for which the difference between the representative value and the target time is minimized regardless of whether the representative value is smaller than the target time.

4. The optimization device for production line according to claim 3,
wherein, when the representative value of the cycle time in the multiple component mounters is larger than the cycle time of a first production device for which the sum of the cycle time and the unit operation time is the maximum among the multiple production devices excluding the component mounters,
the line design section is configured to determine that a buffer device capable of holding the circuit boards and with a predetermined capacity is required between the first production device in the production line and the component mounter.

5. The optimization device for production line according to claim 4,
wherein the line design section is configured to calculate the predetermined capacity required for the buffer device based on the difference between the representative value of the cycle time in the multiple component mounters and the cycle time of the first production device and the execution frequency of the periodic operation in the first production device.

6. The optimization device for production line according to claim 1,
wherein the production device configured to execute the production process at a time set to the target time is a printer that prints solder on the circuit board as the production process, and
the periodic operation includes at least one of cleaning and replenishment of solder which are executed every time a predetermined number of the circuit boards are printed.

7. The optimization device for production line according to claim 1,
wherein when a mounting error occurs in which the component is not properly mounted on the circuit board in the production process by the component mounter, the time required for the production process is extended by a handling time in accordance with execution of an error handling corresponding to the mounting error,
the optimization device includes a memory section configured to store error information in which an error rate and the handling time are set for each type of the mounting error, assuming that the mounting error occurs at a predetermined error rate, and the cycle time setting section is configured to add the handling time of the mounting error to the cycle time of the component mounter.

8. An optimization device for a production line in which multiple production devices each execute a production process, the multiple production devices including multiple component mounters each configured to mount components on a circuit board by conveying the circuit board along the production line as the production process, wherein, when a mounting error occurs in which the component is not properly mounted on the circuit board in the production process by the component mounter, a required time of the production process is increased by a handling time in accordance with execution of an error handling corresponding to the mounting error, the optimization device comprising:

a memory section configured to store error information in which an error rate and the handling time are set for each type of the mounting error, based on an assumption of the mounting error occurring at a predetermined error rate;

a cycle time setting section configured to set a cycle time in each of the production devices, and configured to add the handling time of the mounting error to the cycle time of the component mounter;

a target time setting section configured to set a maximum time of the cycle time in each of the multiple production devices except for the component mounters as a target time, and a line design section configured to calculate the unit number of the component mounters constituting the production line based on the target time.

9. The optimization device for production line according to claim 7,
wherein the cycle time setting section is configured to add the handling time per one circuit board calculated based on the error rate to the cycle time of the component mounter.

10. The optimization device for production line according to claim 9,
wherein the line design section is configured to calculate the unit number of the component mounters for which a difference between a representative value, which is an average value or a maximum value of the cycle time, and the target time of the multiple component mounters is minimized, as the unit number of the component mounters constituting the production line.

11. The optimization device for production line according to claim 7,
wherein, when a representative value, which is an average value or a maximum value of the cycle time in the multiple component mounters, is larger than the cycle time of a second production device for which the cycle time is the maximum of the multiple production devices excluding the component mounters, the line design section is configured to determine that a buffer device capable of holding the circuit boards and with a predetermined capacity is required between the second production device and the component mounter in the production line.

12. The optimization device for production line according to claim 11,
wherein the line design section is configured to calculate the predetermined capacity required for the buffer device based on the difference between the representative value of the cycle time in the multiple component mounters and the cycle time of the second production device and the error rate in the multiple component mounters.

* * * * *